United States Patent
Xie et al.

(10) Patent No.: US 9,593,939 B1
(45) Date of Patent: Mar. 14, 2017

(54) GLUE THICKNESS INSPECTION (GTI)

(71) Applicant: Flextronics AP, LLC, Broomfield, CO (US)

(72) Inventors: Hongqiang Xie, Milpitas, CA (US); An Qi Zhao, Milpitas, CA (US); Jiyang Zhang, Milpitas, CA (US); Zhen Feng, San Jose, CA (US); David Geiger, Milpitas, CA (US)

(73) Assignee: Flextronics AP, LLC, Broomfield, CO (US)

( * ) Notice: Subject to any disclaimer, the term of this patent is extended or adjusted under 35 U.S.C. 154(b) by 0 days.

(21) Appl. No.: 14/584,951

(22) Filed: Dec. 29, 2014

Related U.S. Application Data

(60) Provisional application No. 61/922,028, filed on Dec. 30, 2013.

(51) Int. Cl.
*G01B 11/06* (2006.01)
*G01B 7/00* (2006.01)
*H05K 1/00* (2006.01)
*G01B 17/02* (2006.01)
*H05K 1/02* (2006.01)

(52) U.S. Cl.
CPC ...... *G01B 11/0625* (2013.01); *G01B 11/0691* (2013.01); *G01B 11/06* (2013.01); *G01B 11/0608* (2013.01); *G01B 17/025* (2013.01); *H05K 1/00* (2013.01); *H05K 1/0266* (2013.01)

(58) Field of Classification Search
USPC .... 356/237.1–241.6, 242.1–243.8, 426–431, 356/600–640
See application file for complete search history.

(56) References Cited

U.S. PATENT DOCUMENTS

| | | | | |
|---|---|---|---|---|
| 3,016,464 A | * | 1/1962 | Bailey | G01B 11/06 219/121.8 |
| 3,807,870 A | * | 4/1974 | Kalman | G01B 11/06 250/559.28 |
| 3,994,586 A | * | 11/1976 | Sharkins | G01B 11/065 250/339.06 |
| 4,152,723 A | * | 5/1979 | McMahon | G01R 31/309 250/458.1 |
| 4,183,767 A | * | 1/1980 | Kessler | C09D 5/00 106/236 |
| 4,473,842 A | * | 9/1984 | Suzuki | G01N 21/95607 29/832 |
| 4,697,923 A | * | 10/1987 | Jones | G01N 21/8803 356/237.5 |

(Continued)

*Primary Examiner* — Tri Ton
*Assistant Examiner* — Jarreas C Underwood
(74) *Attorney, Agent, or Firm* — Haverstock & Owens LLP

(57) ABSTRACT

A glue thickness inspection system automates a thickness measurement functionality for determining the thickness of both non-transparent and transparent materials including, but not limited to, glue, gel, solder and epoxy. The glue thickness inspection system includes a laser detector, a movable platform for positioning a unit under test, and a controller for controlling movement of the platform, angle of the laser detector, and calculation of the transparent material thickness. The laser detector includes a laser for emitting a laser light onto the unit under test and a sensor for receiving corresponding reflected light. The sensed data is used by the controller to determine the transparent material thickness.

14 Claims, 4 Drawing Sheets

(56) References Cited

U.S. PATENT DOCUMENTS

| | | | | |
|---|---|---|---|---|
| 5,075,559 A * | 12/1991 | Amir | ............... | G01B 11/0616 |
| | | | | 250/559.27 |
| 5,105,149 A * | 4/1992 | Tokura | ............... | G01R 31/308 |
| | | | | 348/126 |
| 5,212,540 A * | 5/1993 | Miller | ............... | G01B 11/0616 |
| | | | | 356/631 |
| 5,218,206 A * | 6/1993 | Schmitt | ............... | B60R 16/0237 |
| | | | | 250/339.1 |
| 5,568,264 A * | 10/1996 | Nakatsuka | ............... | H05K 13/08 |
| | | | | 356/237.1 |
| 5,657,124 A * | 8/1997 | Zhang | ............... | G01B 11/06 |
| | | | | 356/485 |
| 5,748,091 A * | 5/1998 | Kim | ............... | G08B 19/02 |
| | | | | 244/134 F |
| 5,966,214 A * | 10/1999 | Imbrock | ............... | G01B 11/06 |
| | | | | 356/632 |
| 6,055,058 A * | 4/2000 | Krahbichler | ............... | G01B 11/0633 |
| | | | | 356/630 |
| 6,114,634 A * | 9/2000 | Dittmer | ............... | H05K 3/4638 |
| | | | | 174/250 |
| 6,278,797 B1 * | 8/2001 | Nagasaki | ............... | G01R 31/311 |
| | | | | 250/559.34 |
| 6,683,695 B1 * | 1/2004 | Simpson | ............... | G01N 21/8422 |
| | | | | 356/445 |
| 8,102,542 B2 * | 1/2012 | Gagnon | ............... | B64D 15/20 |
| | | | | 356/625 |
| 8,723,944 B1 * | 5/2014 | Imbrock | ............... | G01B 17/025 |
| | | | | 324/663 |
| 2007/0074415 A1 * | 4/2007 | Gagnon | ............... | B64D 15/20 |
| | | | | 33/630 |
| 2008/0185610 A1 * | 8/2008 | Kushimatsu | ............... | H01L 31/0203 |
| | | | | 257/100 |

* cited by examiner

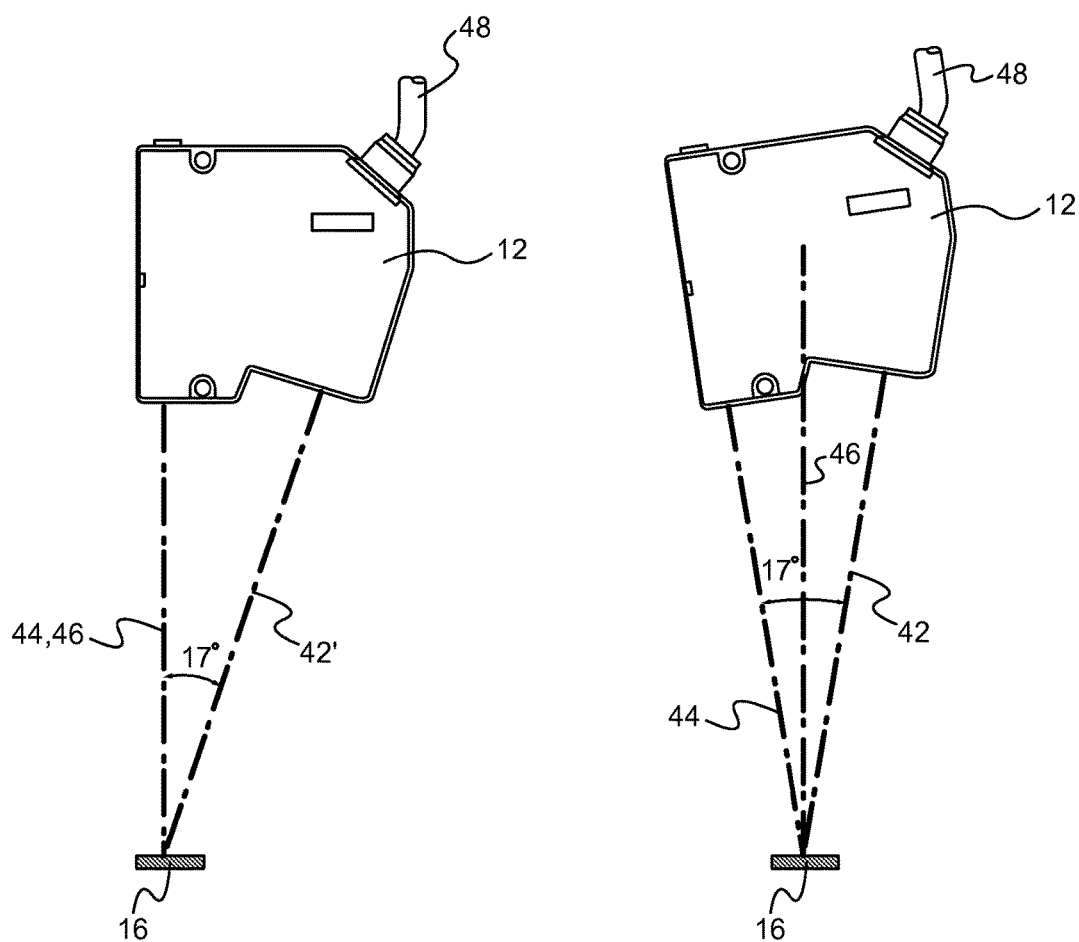

GLUE THICKNESS INSPECTION (GTI)

RELATED APPLICATIONS

This Patent Application claims priority under 35 U.S.C. 119(e) of the U.S. provisional patent application, Application No. 61/922,028, filed on Dec. 30, 2013, and entitled "GLUE THICKNESS INSPECTION (GTI)", which is hereby incorporated in its entirety by reference.

FIELD OF THE INVENTION

The present invention is generally directed to inspection and measurement devices. More specifically, the present invention is directed to a device and system for inspecting and measuring a glue thickness, for example on a glue applied to a printed circuit board.

BACKGROUND OF THE INVENTION

Many electronic devices require application of an adhesive or insulation materials, such as glue, solder or epoxy, as part of the device structure. It is desirable for the application of such materials to fall within tight tolerances for proper reliability and minimized materials use to reduce costs.

Solder paste inspection (SPI) devices are currently available that measure the height of solder applied to a printed circuit board. Conventional SPI devices use structured light directed vertically onto the solder to be measured. As is well known in the art, solder is a non-transparent, colored material. Diffuse reflected light is collected and measured to determine a height of the solder. However, the SPI device is only effective for measuring the height of a non-transparent, colored solder. Conventional SPI devices are not able to measure the height of a transparent material, such as transparent glue.

To measure the height of a transparent material, a manual process is performed whereby an operator places the object including the transparent material to be inspected under a microscope. A series of operations are manually performed using various settings on the microscope, and a height is determined using obtained measurements. This a time consuming process and the results may have large variances.

SUMMARY OF THE INVENTION

A glue thickness inspection system automates a thickness measurement functionality for determining the thickness of both non-transparent and transparent materials including, but not limited to, glue, gel, solder and epoxy. The glue thickness inspection system includes a laser detector, a movable platform for positioning a unit under test, and a controller for controlling movement of the platform, angle of the laser detector, and calculation of the transparent material thickness. The laser detector includes a laser for emitting a laser light onto the unit under test and a sensor for receiving corresponding reflected light. The sensed data is used by the controller to determine the transparent material thickness.

In an aspect, a material inspection system is disclosed. The material inspection system includes a unit under inspection, a laser detector, a controller and a movement and alignment apparatus. The unit under inspection includes a substrate and a transparent material. The substrate has a surface, where the transparent material is coupled to a first portion of the surface and a second portion of the surface is exposed. The laser detector includes a laser light source and a sensor. The laser detector is positioned relative to the unit under inspection such that a laser light output from the laser light source impinges a sample point on the unit under inspection and the laser light has a non-vertical incident angle relative to the first surface of the substrate. The sensor is configured to receive a mirror reflected light corresponding to the laser light. The controller is configured to receive data from the sensor corresponding to the received mirror reflected light and to determine a distance measurement corresponding to the sample point. The movement and alignment apparatus is coupled to the unit under inspection and the laser detector. The movement and alignment apparatus is configured to provide relative movement of the laser detector and the movement and alignment apparatus so as to determine the distance measurement at multiple sample points. At least one sample point is on the second portion of the substrate and at least one sample point is on the transparent material. The controller is further configured to determine a thickness of the transparent material according to the determined distance measurements. In some embodiments, the movement and alignment apparatus is further coupled to the controller, wherein the controller is further configured to automatically control the movement and alignment apparatus to properly align the unit under inspection and the laser detector at the multiple sample points. In some embodiments, the distance measurement corresponds to the distance traveled by the laser light from the laser light source to the sample point on the unit under inspection and to the sensor. In some embodiments, the movement and alignment apparatus includes an X-Y gantry. In some embodiments, the unit under inspection is a printed circuit board assembly. In some embodiments, the transparent material is one of a glue, an epoxy, a gel or a solder. In some embodiments, the controller is configured to determine the thickness of the transparent material by subtracting the distance measurement determined at the sample point on the second portion of the substrate from the distance measurement determined at the sample point on the transparent material.

In another aspect, another material inspection system is disclosed. The material inspection system includes a unit under inspection, a laser detector, a controller and a movement and alignment apparatus. The unit under inspection includes a substrate, a transparent material and a non-transparent material. The substrate includes a surface. The transparent material is coupled to a first portion of the surface and the non-transparent material is coupled to a second portion of the surface. The laser detector includes a laser light source and a sensor. The laser detector is positioned relative to the unit under inspection such that a laser light output from the laser light source impinges a sample point on the unit under inspection. The controller is configured to receive data from the sensor corresponding to the received mirror reflected light and to determine a distance measurement corresponding to the sample point. The movement and alignment apparatus is coupled to the unit under inspection and the laser detector. The movement and alignment apparatus is configured to provide relative movement of the laser detector and the movement and alignment apparatus so as to determine the distance measurement at multiple sample points. At least one sample point on the transparent material and at least one sample point on the non-transparent material. The movement and alignment apparatus is configured to rotate the laser detector between a first position and a second position. In the first position, the sample point is on the transparent material such that the laser light has a non-vertical incident angle relative to the first surface of the substrate and the sensor is configured to receive a mirror reflected light corresponding to the laser light. In the second position, the sample point is on the non-transparent material such that the laser light vertically impinges the sample point and the sensor is configured to receive a diffuse reflected light corresponding to the laser light. The controller is further configured to determine a thickness of the transparent material and the non-transparent material according to the determined distance measurements. In some embodiments, the movement and alignment apparatus is further coupled to the controller, wherein the controller is further configured to automatically control the movement and alignment apparatus to properly align the unit under inspection and the laser detector at the multiple sample points and to properly rotate the laser detector to the first position or the second position. In some embodiments, the distance measurement corresponds to the distance traveled by the laser light from the laser light source to the sample point on the unit under inspection and to the sensor. In some embodiments, the movement and alignment apparatus includes an X-Y gantry. In some embodiments, the unit under inspection is a printed circuit board assembly. In some embodiments, the transparent material is one of a transparent glue, epoxy, gel or solder. In some embodiments, the non-transparent material is one of a non-transparent glue, epoxy, gel or solder.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures:

FIG. 4 illustrates a side view of the laser detector aligned with the unit under inspection in the first position for operation in the mirror reflection mode.

FIG. 5 illustrates a side view of the laser detector aligned with the unit under inspection in the second position for operation in the diffuse reflection mode.

DETAILED DESCRIPTION OF THE EMBODIMENTS

Embodiments of the present application are directed to a glue thickness inspection system. Those of ordinary skill in the art will realize that the following detailed description of the glue thickness inspection system is illustrative only and is not intended to be in any way limiting. Other embodiments of the glue thickness inspection system will readily suggest themselves to such skilled persons having the benefit of this disclosure.

Reference will now be made in detail to implementations of the glue thickness inspection system as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
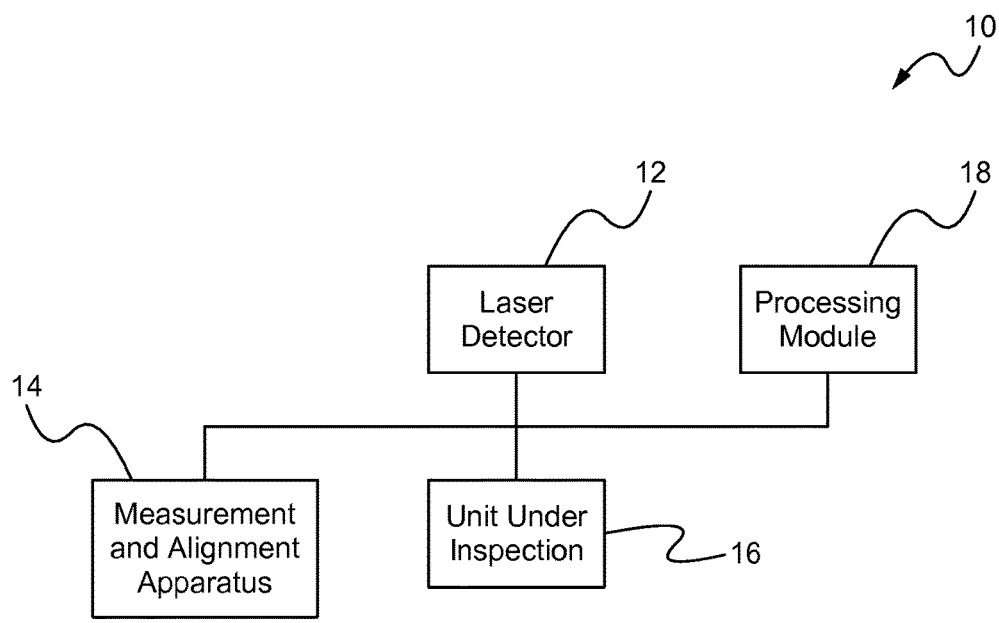
FIG. 1 illustrates a conceptual block diagram of a glue thickness inspection system according to an embodiment.

FIG. 1 illustrates a conceptual block diagram of a glue thickness inspection system according to an embodiment. The glue thickness inspection system 10 includes a laser detector 12, a movement and alignment apparatus 14, a unit under inspection 16 and a processing module 18. The laser detector 12 includes a laser for emitting a laser light onto the unit under inspection 16 and a sensor for receiving corresponding reflected light. The sensed data is provided to the processing module 18.

The movement and alignment apparatus 14 is configured to secure the unit under inspection 16 and properly align the laser detector 12 and the unit under inspection 16 relative to each other. The laser detector 12 and the unit under inspection 16 are properly aligned by moving either the laser detector 12 and/or the unit under inspection 16. In some embodiments, an X-Y gantry is used. The unit under inspection 16 is mounted to a platform and the laser detector is mounted above the platform. In some embodiments, the platform is moveable so as to move the mounted unit under inspection 16 in an X-Y plane while the laser detector 12 remains stationary. In other embodiments, the laser detector 12 is movably mounted so as to move in an X-Y plane and the platform is stationary. In still other embodiments, both the platform is movable and the laser detector 12 is movably mounted. The movement and alignment apparatus 14 is configured to properly align the laser detector 12 and the unit under inspection 16 so that a thickness measurement can be made at one or more sampling points on the unit under inspection 16. The laser detector 12 is also movably mounted to rotate the laser detector 12 so as to adjust an angle of incidence of an output laser light unto the unit under inspection 16. The angle of incidence changes depending on whether the glue thickness inspection system 10 is operating according to a diffuse reflection mode or a mirror reflection mode, as is described in greater detail below. The movement and alignment apparatus 16 and the mount for the laser detector 12 can be configured to be moved manually or through automated control.

The processing module 18 can include one or more controllers and/or electronic devices, which can be separate, integrated or some combination, for controlling the movement and alignment apparatus 14 and the laser detector 12, processing the sensed reflected laser data to generate corresponding wave profiles, running one or more algorithms for sampling at multiple points on the unit under inspection, and analyzing the wave profiles to determine the glue thickness. The processing module 18 can also include user input/output such as a display for displaying raw data, intermediate data and analysis results, as well as a keyboard, mouse or other user interface apparatus as are well know in the art.

The unit under inspection 16 can be an object of which a thickness measurement is desired. In some embodiments, the unit under inspection 16 is a printed circuit board assembly onto which a layer of transparent glue is added, and it is a thickness of the transparent glue layer that is determined. It is understood that the a thickness measurement of transparent materials other than transparent glue can be determined.

In an exemplary application, a top surface of a printed circuit board having a number of surface mounted components is covered with a layer of transparent glue that functions as an insulating cover to protect against moisture, pollution, chemical corrosion, shock and the like. In such an application, a dam is first formed on the top surface of the printed circuit board. The dam is positioned as a perimeter boundary surrounding the surface mounted components to be insulated. In some embodiments, the dam is made of a non-transparent black glue. After the dam is formed, the interior of the dam is filled with the transparent glue, the dam providing a barrier for holding the transparent glue in place. One or more heating steps are performed to cure both the non-transparent black glue and the transparent glue. The height of the dam is greater than the thickness of the transparent glue. The transparent glue has a minimum height for sufficiently covering one, some or all of the surface mounted components. The minimum thickness is application specific. Applying the transparent glue so as to have a thickness that is at least as great, and as close as possible to the minimum thickness, enables proper reliability of the insulating cover and minimizes material costs. In some embodiments, the thickness of the transparent glue and the dam are determined after both are cured.

Figure 2:
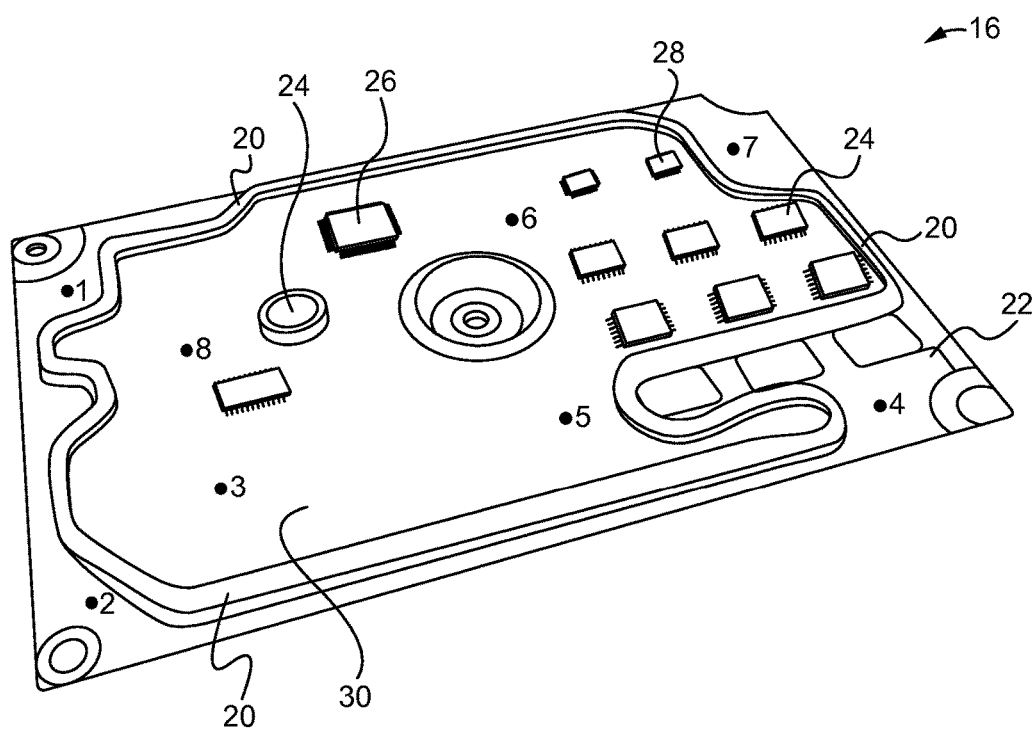
FIG. 2 illustrates a top down perspective view of an exemplary unit under inspection according to an embodiment.

FIG. 2 illustrates a top down perspective view of an exemplary unit under inspection according to an embodiment. In this embodiment, the unit under inspection 16 is a printed circuit board assembly. The printed circuit board assembly includes a printed circuit board (PCB) 22 onto which various electrical components, such as components 24, 26 and 28, can be mounted or fabricated. The components can include active or passive components. As used herein, reference to components may also refer to the electrical interconnects, such as metal traces and bond pads, formed on the PCB 22. A dam 20 is applied to the surface of the PCB 22. The dam 20 is configured as a perimeter to surround one, some or all of the components coupled to the surface of the PCB 22. A transparent glue 30 is applied within the perimeter formed by the dam 20. A minimum thickness of the transparent glue 30 is determined according to application specific design parameters. One, some or all of the components can be completely covered or only partially covered by the transparent glue 30. For example, the components 24 are not completely covered by the transparent glue 30 and a portion of the components 24 are exposed, and the components 26 and 28 are completely covered by the transparent glue 30. Surface interconnects such as metal traces and bond pads are also covered by the transparent glue 30. Locations labeled as points 1, 2, 3, 4, 5, 6, 7 and 8 are exemplary sample points at which a height measurement can be determined, as described in detail below. It is understood that alternative locations than points 1-8 can be used as sample points.

Figure 3:
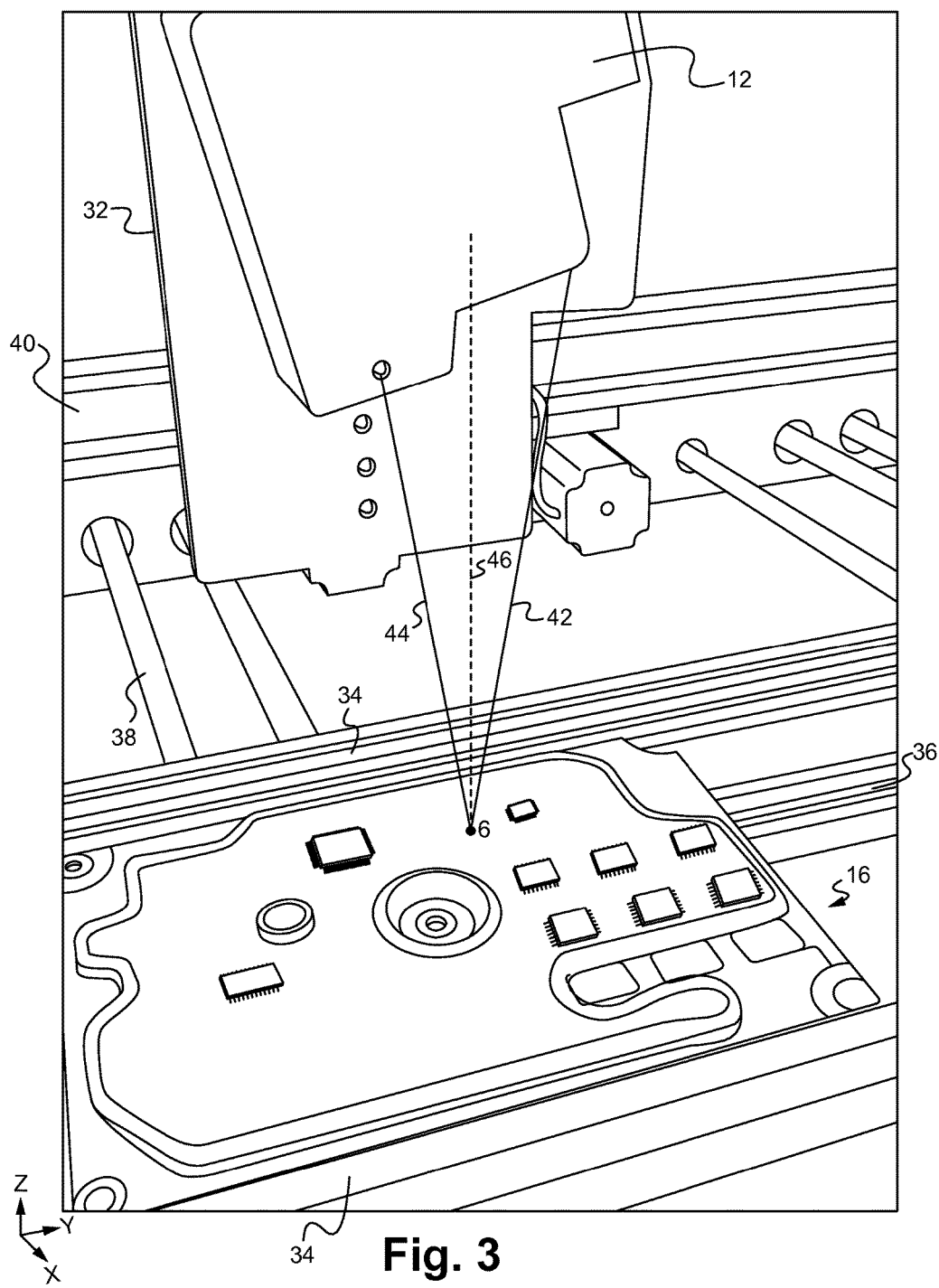
FIG. 3 illustrates an implementation of the glue thickness inspection system according to an embodiment.

FIG. 3 illustrates an implementation of the glue thickness inspection system according to an embodiment. The glue thickness inspection system 10 includes the unit under inspection 16 mounted to the movement and alignment apparatus. As shown in FIG. 3, the movement and alignment apparatus includes a platform 36 onto which the unit under inspection 16 is positioned. In some embodiments, a securing mechanism, such as one or more clamps (not shown), can be used to secure the unit under inspection 16 to the platform 36. Guide rails 34 can also be used to properly securing and align the unit under inspection 16 as the unit under inspection 16 is moved in the Y-direction. An X-direction movement mechanism 38, such as a screw, is coupled to the guide rails 34, such that the guide rails 34, the platform 36 and the unit under inspection 16 can be wholly moved in the X-direction. A support 40 is coupled to the X-direction movement mechanism 38. A Y-direction movement mechanism (not shown) can be coupled to the unit under inspection 16 such that the unit under inspection 16 can be moved in the Y-direction. The support 40, or alternative support (not shown) can be coupled to the Y-direction movement mechanism. The unit under inspection 16 is able to be moved in an X-Y plane defined as the inspection area. In some embodiments, the X-direction movement mechanism, the Y-direction movement mechanism, the guide rails, the supports and the securing mechanism are part of an X-Y gantry. In some embodiments, the movement and alignment apparatus is coupled to an automated conveyor to support inline loading and unloading of the unit under inspection 16.

The laser and detector 12 is positioned over the inspection area. The laser and detector 12 is mounted to the laser and detector mount 32. The laser and detector mount 32 is mounted to the support 40. In some embodiments, the laser and detector mount 32 enables movement of the laser and detector 12 in an X-Y plane above the inspection area. The laser and detector mount 32 also enables the laser and detector 12 to be rotated within a Y-Z plane.

In some embodiments, the laser and detector 12 is rotatable between a first position and a second position. Rotating the laser and detector 12 changes an angle of incidence of the laser light output from the laser and detector 12. The first position corresponds to the mirror reflection mode. The second position corresponds to the diffuse reflection mode, which is shown in FIG. 5. In the first position shown in FIG. 3, the incident laser light 44 output from the laser and detector 12 impinges the sample point 6 off-angle relative to the vertical axis 46, or Z-direction. The resulting mirror reflected light 42 is received by the laser and detector 12. The laser and detector 12 includes a laser light source, a sensor and optics for directing the laser light generated by the laser light source and for directing received reflected light to the sensor. FIG. 4 illustrates a side view of the laser detector 12 aligned with the unit under inspection 16 in the first position for operation in the mirror reflection mode. In the exemplary configuration shown in FIG. 4, the laser detector 12 is configured such that the incident laser light 44 and the mirror reflected light 42 form an angle of 17 degrees. This angle is a function of the laser light wavelength generated by the laser light source. It is understood that different angles may be used for different laser light wavelengths. In the mirror reflection mode, the angle between the mirror reflected light 42 and the vertical 46 is the same as the angle between the incident laser light 44 and the vertical 46, which is 8.5 degrees in this embodiment. In other words, the incident angle is equal to the reflected angle. An electrical cable 48 couples the laser detector 12 to the processing module 18 (not shown).

Figure 6:
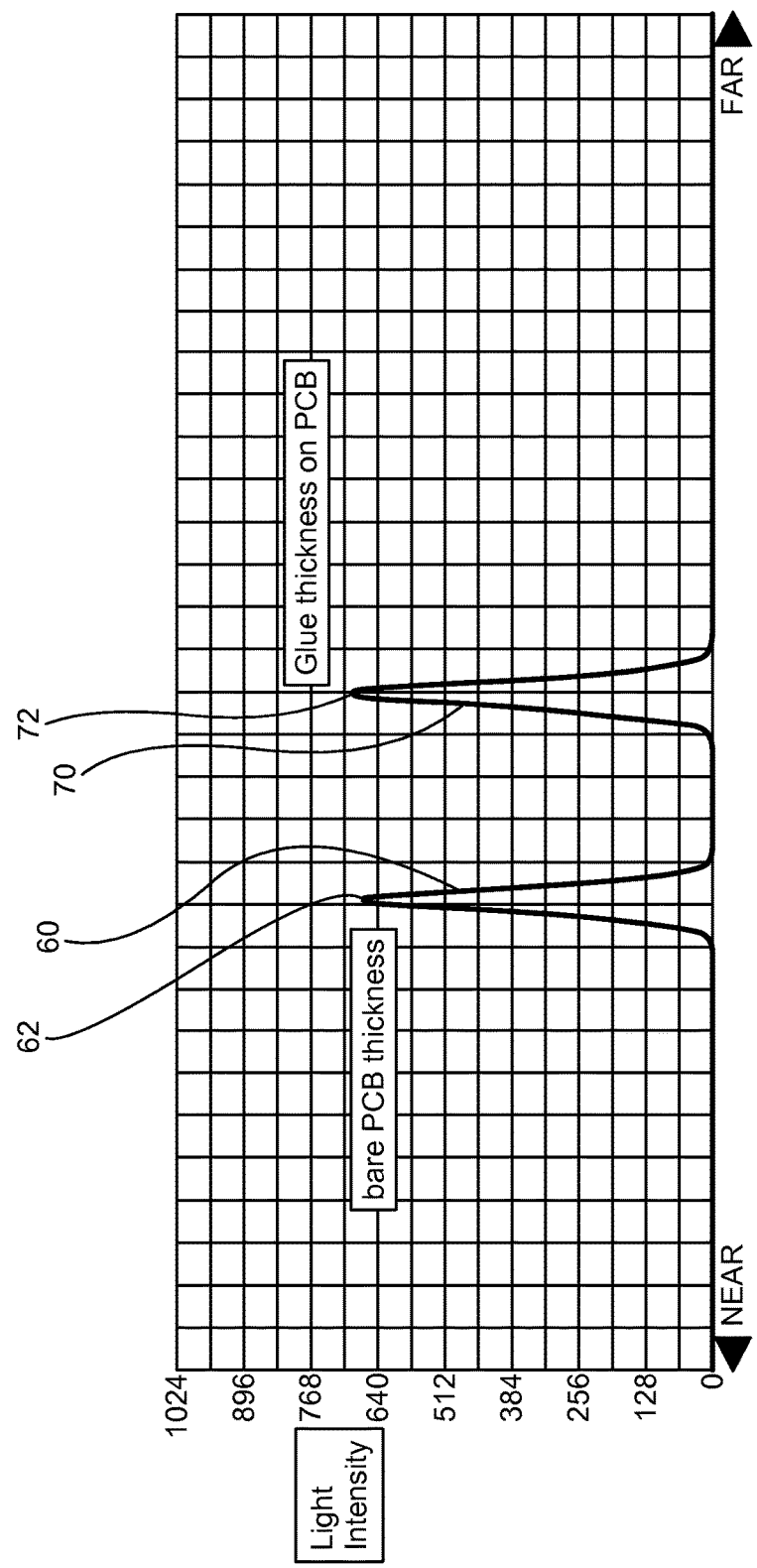
FIG. 6 illustrates exemplary wave profiles corresponding to received mirror reflected light for relative distance measures.

When operating in the mirror reflection mode, the laser detector 12 is positioned in the first position corresponding to the mirror reflection mode. Next, a first relative distance measurement is performed. The laser detector 12 and the PCB 22 are aligned so as to perform a distance measurement at one or more sample points on a bare surface of the PCB 22, such as at points 1, 2, 4 and 7 in FIG. 2, where no glue has been applied. This first relative distance measurement at each sample point is a relative measure and represents a distance between the laser light source and the sensor along the incident light path to the sample point on the bare surface of the PCB and from the sample point along the mirror reflected light path to the sensor. FIG. 6 illustrates exemplary wave profiles corresponding to received mirror reflected light for relative distance measures. The graph shown in FIG. 6 is a measure of light intensity versus distance traveled. The wave profile 60 corresponds to the wave profile for an exemplary sample point on the bare PCB surface, such as sample point 1 in FIG. 2. A peak light intensity value 62 of the wave profile 60 corresponds to the distance traveled by the laser light from the laser light source to the sample point on the bare surface of the PCB and to the sensor and represents a relative height measurement. This height measurement establishes a base level for the PCB 22. In some embodiments, the base level is an average or mean of multiple sample points.

Next, a second relative distance measurement is taken at one or more sample points where the transparent glue 30 is applied to the surface of the PCB 22, such as at sample points 3, 5, 6 and 8 in FIG. 2. The second relative distance measurement at each sample point is a relative measure and represents a distance between the laser light source and the sensor along the incident light path to the sample point on the surface of the transparent glue and from the sample point along the mirror reflected light path to the sensor. Referring again to FIG. 6, the wave profile 70 corresponds to the wave profile for the exemplary sample point on the surface of the transparent glue 30, such as sample point 3 in FIG. 2. A peak light intensity value 72 of the wave profile 70 corresponds to the distance traveled by the laser light from the laser light source to the sample point on the surface of the transparent glue and to the sensor and represents a relative height measurement. This relative height measurement establishes a base level for the transparent glue thickness. In some embodiments, the base level is an average or mean of multiple sample points.

An actual thickness of the transparent glue is determined by subtracting the base level of the PCB 22 from the base level of the transparent glue 30. The resulting value is the transparent glue thickness. The processing module 18 includes one or more algorithms configured to determine the first and second relative distance measurements, the base levels, and the transparent glue thickness based on the data received from the sensor in the laser detector 12.

FIG. 5 illustrates a side view of the laser detector 12 aligned with the unit under inspection 16 in the second position for operation in the diffuse reflection mode. The diffuse reflection mode is used to determine a thickness measurement of a non-transparent material, such as a non-transparent glue. In the diffuse reflection mode, the laser detector 12 is rotated relative to the mirror reflection mode such that the incident laser light 44 is aligned along the vertical 46. In the exemplary configuration shown in FIG. 5, the laser detector 12 is configured such that the incident laser light 44 and the diffuse reflected light 42' form an angle of 17 degrees. This angle is also a function of the laser light wavelength generated by the laser light source. It is understood that different angles may be used for different laser light wavelengths.

Operation in the diffuse reflection mode is similar to that of the mirror reflection mode except that the sensor receives diffuse reflected light instead of mirror reflected light. First, a first relative distance measurement is performed. The laser detector 12 and the PCB 22 are aligned so as to perform a distance measurement at one or more sample points on a bare surface of the PCB 22, such as at points 1, 2, 4 and 7 in FIG. 2, where no glue has been applied. A peak light intensity value of a corresponding wave profile corresponds to the distance traveled by the laser light from the laser light source along the incident light path to the sample point on the bare surface of the PCB and from the sample point along the diffuse reflected light path to the sensor and represents a relative height measurement. This height measurement establishes a base level for the PCB 22. In some embodiments, the base level is an average or mean of multiple sample points.

Next, a second relative distance measurement is taken at one or more sample points where the non-transparent glue is applied to the surface of the PCB 22, such as at one or more sample points on the dam 20 in FIG. 2. The second relative distance measurement at each sample point is a relative measure and represents a distance between the laser light source and the sensor along the incident light path to the sample point on the surface of the non-transparent glue and from the sample point along the diffuse reflected light path to the sensor. A peak light intensity value of a corresponding wave profile corresponds to the distance traveled by the laser light from the laser light source to the sample point on the surface of the non-transparent glue and to the sensor and represents a relative height measurement. This relative height measurement establishes a base level for the non-transparent glue thickness. In some embodiments, the base level is an average or mean of multiple sample points.

An actual thickness of the non-transparent glue is determined by subtracting the base level of the PCB 22 from the base level of the non-transparent glue, such as the dam 20. The resulting value is the non-transparent glue thickness. The processing module 18 includes one or more algorithms configured to determine the first and second relative distance measurements, the base levels, and the non-transparent glue thickness based on the data received from the sensor in the laser detector 12.

The processing module 18 is coupled to the movement and alignment apparatus 14 to automatically control movement of the laser detector 12 and/or the unit under inspection 16 so as to provide proper alignment for performing height measurements at one or more designated sample points using one of the two modes of operation.

The present application has been described in terms of specific embodiments incorporating details to facilitate the understanding of the principles of construction and operation of the glue thickness inspection system. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:
1. A material inspection system comprising:
 a. a unit under inspection comprising a substrate and a transparent material, wherein the substrate comprises a surface, the transparent material is coupled to a first portion of the surface and a second portion of the surface is exposed;
 b. a laser detector comprising a laser light source and a sensor, wherein the laser detector is positioned relative to the unit under inspection such that a laser light output from the laser light source impinges a sample point on the unit under inspection and the laser light has a non-vertical incident angle relative to the surface of the substrate, further wherein the sensor is configured to receive a mirror reflected light corresponding to the laser light;

c. a controller configured to receive data from the sensor corresponding to the received mirror reflected light and to determine a distance measurement corresponding to the sample point; and d. a movement and alignment apparatus coupled to the unit under inspection and the laser detector, wherein the movement and alignment apparatus is configured to provide relative movement of the laser detector and the movement and alignment apparatus so as to determine the distance measurement at multiple sample points, at least one sample point on the second portion of the substrate and at least one sample point on the transparent material, wherein the controller is further configured to determine a thickness of the transparent material according to the determined distance measurements.

2. The material inspection system of claim 1 wherein the movement and alignment apparatus is further coupled to the controller, wherein the controller is further configured to automatically control the movement and alignment apparatus to properly align the unit under inspection and the laser detector at the multiple sample points.

3. The material inspection system of claim 1 wherein the distance measurement corresponds to the distance traveled by the laser light from the laser light source to the sample point on the unit under inspection and to the sensor.

4. The material inspection system of claim 1 wherein the movement and alignment apparatus comprises an X-Y gantry.

5. The material inspection system of claim 1 wherein the unit under inspection comprises a printed circuit board assembly.

6. The material inspection system of claim 1 wherein the transparent material comprises one of a glue, an epoxy, a gel or a solder.

7. The material inspection system of claim 1 wherein the controller is configured to determine the thickness of the transparent material by subtracting the distance measurement determined at the sample point on the second portion of the substrate from the distance measurement determined at the sample point on the transparent material.

8. A material inspection system comprising:

a. a unit under inspection comprising a substrate, a transparent material and a non-transparent material, wherein the substrate comprises a surface, the transparent material is coupled to a first portion of the surface and the non-transparent material is coupled to a second portion of the surface;

b. a laser detector comprising a laser light source and a sensor, wherein the laser detector is positioned relative to the unit under inspection such that a laser light output from the laser light source impinges a sample point on the unit under inspection;

c. a controller configured to receive data from the sensor corresponding to the received mirror reflected light and to determine a distance measurement corresponding to the sample point; and d. a movement and alignment apparatus coupled to the unit under inspection and the laser detector, wherein the movement and alignment apparatus is configured to provide relative movement of the laser detector and the movement and alignment apparatus so as to determine the distance measurement at multiple sample points, at least one sample point on the transparent material and at least one sample point on the non-transparent material, further wherein the movement and alignment apparatus is configured to rotate the laser detector between a first position when the sample point is on the transparent material such that the laser light has a non-vertical incident angle relative to the surface of the substrate and the sensor is configured to receive a mirror reflected light corresponding to the laser light, and a second position when the sample point is on the non-transparent material such that the laser light vertically impinges the sample point and the sensor is configured to receive a diffuse reflected light corresponding to the laser light, wherein the controller is further configured to determine a thickness of the transparent material and the non-transparent material according to the determined distance measurements.

9. The material inspection system of claim 8 wherein the movement and alignment apparatus is further coupled to the controller, wherein the controller is further configured to automatically control the movement and alignment apparatus to properly align the unit under inspection and the laser detector at the multiple sample points and to properly rotate the laser detector to the first position or the second position.

10. The material inspection system of claim 8 wherein the distance measurement corresponds to the distance traveled by the laser light from the laser light source to the sample point on the unit under inspection and to the sensor.

11. The material inspection system of claim 8 wherein the movement and alignment apparatus comprises an X-Y gantry.

12. The material inspection system of claim 8 wherein the unit under inspection comprises a printed circuit board assembly.

13. The material inspection system of claim 8 wherein the transparent material comprises one of a transparent glue, epoxy, gel or solder.

14. The material inspection system of claim 8 wherein the non-transparent material comprises one of a non-transparent glue, epoxy, gel or solder.

* * * * *